United States Patent
Hieslmair

(10) Patent No.: US 9,343,606 B2
(45) Date of Patent: May 17, 2016

(54) SOLAR CELL STRUCTURES, PHOTOVOLTAIC PANELS AND CORRESPONDING PROCESSES

(71) Applicant: NanoGram Corporation, Milpitas, CA (US)

(72) Inventor: Henry Hieslmair, San Francisco, CA (US)

(73) Assignee: NanoGram Corporation, Milpitas, CA (US)

(*) Notice: Subject to any disclaimer, the term of this patent is extended or adjusted under 35 U.S.C. 154(b) by 708 days.

(21) Appl. No.: 13/665,214

(22) Filed: Oct. 31, 2012

(65) Prior Publication Data

US 2013/0056069 A1     Mar. 7, 2013

Related U.S. Application Data

(63) Continuation of application No. 13/474,425, filed on May 17, 2012, now Pat. No. 8,409,976, which is a continuation of application No. 12/070,371, filed on Feb. 15, 2008, now Pat. No. 8,853,527.

(60) Provisional application No. 60/902,006, filed on Feb. 16, 2007.

(51) Int. Cl.
*H01L 31/061* (2012.01)
*H01L 31/068* (2012.01)
(Continued)

(52) U.S. Cl.
CPC .......... *H01L 31/0682* (2013.01); *H01L 21/228* (2013.01); *H01L 31/02* (2013.01); *H01L 31/022441* (2013.01); *H01L 31/042* (2013.01); *H01L 31/046* (2014.12);
(Continued)

(58) Field of Classification Search
CPC ..... H01L 31/00; H01L 31/02; H01L 31/0224; H01L 31/022425; H01L 31/022433; H01L 31/0248; H01L 31/0256; H01L 31/028; H01L 31/0288; H01L 31/0352; H01L 31/04; H01L 31/18; H01L 31/1804–31/1812; H01L 31/02008
See application file for complete search history.

(56) References Cited

U.S. PATENT DOCUMENTS 4,045,245 A    8/1977  Coleman
4,133,698 A    1/1979  Chiang et al.
(Continued)

FOREIGN PATENT DOCUMENTS

CN    1120245 A    4/1996
CN    1241298 A    1/2000
(Continued)

OTHER PUBLICATIONS

English machine translation of Mishima (JP 2004-221188), published on Aug. 5, 2004.*
(Continued)

*Primary Examiner* — Christina Chern
(74) *Attorney, Agent, or Firm* — Dardi & Herbert, PLLC; Peter S. Dardi

(57) ABSTRACT

Photovoltaic modules comprise solar cells having doped domains of opposite polarities along the rear side of the cells. The doped domains can be located within openings through a dielectric passivation layer. In some embodiments, the solar cells are formed from thin silicon foils. Doped domains can be formed by printing inks along the rear surface of the semiconducting sheets. The dopant inks can comprise nanoparticles having the desired dopant.

19 Claims, 7 Drawing Sheets

(51) Int. Cl.

| | | |
|---|---|---|
| *H01L 31/042* | (2014.01) | |
| *H01L 31/18* | (2006.01) | |
| *H01L 31/0224* | (2006.01) | |
| *H01L 31/05* | (2014.01) | |
| *H01L 21/228* | (2006.01) | |
| *H01L 31/02* | (2006.01) | |
| *H01L 31/046* | (2014.01) | |
| *H02S 40/32* | (2014.01) | |
| *H02S 50/10* | (2014.01) | |
| *H01L 21/268* | (2006.01) | |

(52) U.S. Cl.
CPC ....... *H01L 31/0504* (2013.01); *H01L 31/0516* (2013.01); *H01L 31/061* (2013.01); *H01L 31/1804* (2013.01); *H02S 40/32* (2014.12); *H01L 21/268* (2013.01); *H02S 50/10* (2014.12); *Y02E 10/547* (2013.01); *Y02P 70/521* (2015.11)

(56) References Cited

U.S. PATENT DOCUMENTS

| | | |
|---|---|---|
| 4,147,563 A | 4/1979 | Narayan et al. |
| 4,227,942 A | 10/1980 | Hall |
| 4,315,097 A | 2/1982 | Solomon |
| 4,478,879 A | 10/1984 | Baraona et al. |
| 4,667,060 A | 5/1987 | Spitzer |
| 4,703,553 A | 11/1987 | Mardesich |
| 4,783,421 A | 11/1988 | Carlson et al. |
| 4,927,770 A | 5/1990 | Swanson |
| 5,011,565 A | 4/1991 | Dube et al. |
| 5,082,791 A | 1/1992 | Micheels et al. |
| 5,096,505 A | 3/1992 | Fraas et al. |
| 5,302,198 A | 4/1994 | Allman |
| 5,330,584 A | 7/1994 | Saga et al. |
| 5,487,852 A | 1/1996 | Ludden et al. |
| 5,538,564 A | 7/1996 | Kaschmitter |
| 5,580,395 A | 12/1996 | Yoshioka et al. |
| 5,609,694 A | 3/1997 | Asai |
| 5,641,362 A | 6/1997 | Meier |
| 5,814,238 A | 9/1998 | Ashby et al. |
| 5,956,572 A | 9/1999 | Kidoguchi et al. |
| 5,973,260 A | 10/1999 | Tange et al. |
| 6,034,321 A | 3/2000 | Jenkins |
| 6,093,882 A | 7/2000 | Arimoto |
| 6,180,869 B1 | 1/2001 | Meier et al. |
| 6,337,283 B1 | 1/2002 | Verlinden et al. |
| 6,387,726 B1 | 5/2002 | Verlinden et al. |
| 6,423,568 B1 | 7/2002 | Verlinden et al. |
| 6,429,037 B1 | 8/2002 | Wenham et al. |
| 6,455,347 B1 | 9/2002 | Hiraishi et al. |
| 6,495,468 B2 | 12/2002 | Sandhu et al. |
| 6,552,259 B1 | 4/2003 | Hosomi et al. |
| 6,552,414 B1 | 4/2003 | Horzel et al. |
| 6,674,086 B2 | 1/2004 | Kamada et al. |
| 6,695,903 B1 | 2/2004 | Kübelbeck et al. |
| 6,788,866 B2 | 9/2004 | Bryan |
| 6,846,696 B2 | 1/2005 | Adachi et al. |
| 6,849,334 B2 | 2/2005 | Horne et al. |
| 6,919,530 B2 | 7/2005 | Borgeson et al. |
| 6,921,893 B1 | 7/2005 | Petschik et al. |
| 6,927,417 B2 | 8/2005 | Nagashima et al. |
| 6,982,218 B2 | 1/2006 | Preu et al. |
| 6,998,288 B1 | 2/2006 | Smith et al. |
| 7,135,350 B1 | 11/2006 | Smith et al. |
| 7,196,018 B2 | 3/2007 | Szlufcik et al. |
| 7,217,883 B2 | 5/2007 | Munzer |
| 7,270,886 B2 | 9/2007 | Lee et al. |
| RE39,988 E | 1/2008 | Wickboldt et al. |
| 7,339,110 B1 | 3/2008 | Mulligan et al. |
| 7,365,004 B2 | 4/2008 | Adachi et al. |
| 7,388,147 B2 | 6/2008 | Mulligan et al. |
| 7,414,379 B2 | 8/2008 | Oks |
| 7,435,668 B2 | 10/2008 | Machida et al. |
| 7,468,485 B1 | 12/2008 | Swanson |
| 7,491,431 B2 | 2/2009 | Chiruvolu |
| 7,521,340 B2 | 4/2009 | Lemmi et al. |
| 7,554,031 B2 | 6/2009 | Swanson et al. |
| 7,572,740 B2 | 8/2009 | Terry et al. |
| 7,575,784 B1 | 8/2009 | Bi et al. |
| 7,615,393 B1 | 11/2009 | Shah et al. |
| 7,704,866 B2 | 4/2010 | Vanheusden et al. |
| 7,718,707 B2 | 5/2010 | Kelman et al. |
| 7,776,724 B2 | 8/2010 | Lemmi et al. |
| 7,851,336 B2 | 12/2010 | Poplavskyy et al. |
| 7,910,393 B2 | 3/2011 | Kim et al. |
| 7,923,368 B2 | 4/2011 | Terry et al. |
| 7,998,359 B2 | 8/2011 | Rogojina et al. |
| 8,048,814 B2 | 11/2011 | Meisel et al. |
| 8,139,070 B1 | 3/2012 | Ostiguy et al. |
| 8,148,176 B2 | 4/2012 | Kelman et al. |
| 8,163,587 B2 | 4/2012 | Scardera et al. |
| 2003/0228415 A1 | 12/2003 | Bi et al. |
| 2004/0063326 A1 | 4/2004 | Szlufcik et al. |
| 2004/0097062 A1 | 5/2004 | Preu et al. |
| 2004/0242019 A1 | 12/2004 | Klein et al. |
| 2004/0261840 A1 | 12/2004 | Schmit et al. |
| 2005/0008880 A1 | 1/2005 | Kunze et al. |
| 2005/0181566 A1 | 8/2005 | Machida et al. |
| 2006/0094189 A1 | 5/2006 | Zurcher et al. |
| 2006/0134347 A1 | 6/2006 | Chiruvolu et al. |
| 2006/0237719 A1 | 10/2006 | Colfer et al. |
| 2007/0137699 A1 | 6/2007 | Manivannan et al. |
| 2007/0151598 A1 | 7/2007 | De Ceuster et al. |
| 2007/0212510 A1 | 9/2007 | Hieslmair et al. |
| 2008/0138966 A1 | 6/2008 | Rogojina et al. |
| 2008/0160265 A1 | 7/2008 | Hieslmair et al. |
| 2008/0160733 A1 | 7/2008 | Hieslmair et al. |
| 2008/0173347 A1 | 7/2008 | Korevaar et al. |
| 2008/0202576 A1 | 8/2008 | Hieslmair |
| 2008/0202577 A1 | 8/2008 | Hieslmair |
| 2008/0210301 A1 | 9/2008 | Milligan et al. |
| 2008/0216886 A1 | 9/2008 | Iwakura |
| 2008/0223437 A1 | 9/2008 | De Ceuster |
| 2008/0251121 A1 | 10/2008 | Stone |
| 2008/0299297 A1 | 12/2008 | Cousins et al. |
| 2008/0305619 A1 | 12/2008 | Lemmi et al. |
| 2009/0017292 A1 | 1/2009 | Hieslmair et al. |
| 2009/0151784 A1 | 6/2009 | Luan et al. |
| 2009/0191348 A1 | 7/2009 | Hieslmair et al. |
| 2010/0216299 A1 | 8/2010 | Poplavskyy et al. |
| 2010/0221903 A1 | 9/2010 | Poplavskyy et al. |
| 2010/0267194 A1 | 10/2010 | Aleman et al. |
| 2010/0275990 A1 | 11/2010 | Shimomura et al. |
| 2010/0294352 A1 | 11/2010 | Srinivasan et al. |
| 2011/0003464 A1 | 1/2011 | Scardera et al. |
| 2011/0003465 A1 | 1/2011 | Scardera et al. |
| 2011/0003466 A1 | 1/2011 | Scardera et al. |
| 2011/0053352 A1 | 3/2011 | Poplavskyy et al. |
| 2011/0120530 A1 | 5/2011 | Isaka |
| 2011/0183504 A1 | 7/2011 | Scardera et al. |
| 2012/0009721 A1 | 1/2012 | Abbott et al. |

FOREIGN PATENT DOCUMENTS

| | | | |
|---|---|---|---|
| EP | 0108065 B1 | 12/1983 | |
| EP | 1732142 A1 * | 12/2006 | ............ H01L 31/068 |
| JP | S60-005100 A | 1/1985 | |
| JP | 62066684 | 3/1987 | |
| JP | 9-172196 | 6/1997 | |
| JP | H10-261810 A | 11/1998 | |
| JP | 2001-093849 | 4/2001 | |
| JP | 2002-539615 | 11/2002 | |
| JP | 2004-221188 * | 8/2004 | ............. H01L 31/04 |
| JP | 2005-506705 | 3/2005 | |
| JP | 2005-510885 | 4/2005 | |
| JP | 2005-203622 A | 7/2005 | |
| JP | 2005-340362 | 8/2005 | |
| JP | 2005-260040 | 9/2005 | |
| JP | 2005-322780 | 11/2005 | |
| JP | 2006-173381 | 6/2006 | |
| JP | 2006-294802 | 10/2006 | |
| JP | 2007-281044 | 10/2007 | |
| JP | 2008-186927 | 8/2008 | |

(56) References Cited

FOREIGN PATENT DOCUMENTS

| | | |
|---|---|---|
| JP | 2009-206375 | 10/2009 |
| JP | 2010-283339 | 12/2010 |
| KR | 10-2005-0081174 | 8/2005 |
| WO | 83/02200 | 6/1983 |
| WO | 02/32588 | 4/2002 |
| WO | 2006/096247 | 9/2006 |
| WO | 2007/004501 A1 | 1/2007 |
| WO | 2007/081510 A2 | 7/2007 |
| WO | 2007/117153 A2 | 10/2007 |
| WO | 2008/039078 A2 | 4/2008 |
| WO | 2008/065918 A1 | 6/2008 |
| WO | 2008/103293 | 8/2008 |
| WO | 2009/017420 A2 | 2/2009 |
| WO | 2009/025147 A1 | 2/2009 |
| WO | 2009/028974 A1 | 3/2009 |
| WO | 2009/131587 A1 | 10/2009 |
| WO | 2010/050936 A1 | 5/2010 |
| WO | 2012/012166 A1 | 1/2012 |

OTHER PUBLICATIONS

Bruton et al., "Prospects for high efficiency silicon solar cells in thin czochralski waffers using industrial processes," Photovoltaics Specialists Conference, 2008. Conference Record of the Twenty-Eighth IEEE.
Cotter et al., "Novel Processes for Simplified Buried Contact Solar Cells", Conference Record of the 28th IEEE Photovoltaics Specialists Conference, Sep. 15-22, 2000, pp. 303-306.
Coutanson et al., "Fabrication of p+/n ultra shallow junctions (USJ) in silicon by excimer laser doping from spin-on glass sources", Mat. Res. Soc. Symp. Proc., 810:C4.13.1-C4.13.6 (2004).
Deutsch et al., "Efficient Si solar cells by laser photochemical doping" Appl. Phys. Lett., 38(3):144-146 (Feb. 1, 1981).
Dihu et al, "CO2 pulsed techniques for solar cell processing", Acta Scientiarum Naturalium Universitatis Sunyatseni, 35(4):120-123 (Jul. 1996) (Abstract).
Duerinckx, et al., "Simple and Efficient Screen Printing Process for Multicrystalline Silicon Solar Cells based on Firing through Silicon Nitride", 14th European Photovoltaic Solar Energy Conference, Jun. 30-Jul. 4, 1997, Barcelona, Spain, pp. 792-795.
Feldrapp et al., "Thin-film solar cells from layer transfer using porous silicon with 32.7 mA/cm2 short circuit current density", Progress in Photovoltaics. Mar. 2003, pp. 1-23.
Glunz et al., "Laser-Fired Contact Silicon Solar Cells on p- and n-Substrates", 19th European Photovoltaic Solar Energy Conference, Jun. 7-11, 2004, Paris, France, pp. 408-411.
Huljić et al., "Development of a 21% back-contact monocrystalline silicon solar cell for large-scale production", Proceedings of the 21st EU PVSEC, Dresden 2006, 4 pages.
Kray et al., "Analysis of very thin high-efficiency solar cells". WPEC-3, Osaka, Japan, May 11-18, 2003.
Lasers in Solar Manufacturing, The Cutting-Edge of Green Solar Panel Production (brochure) by Coherent, Inc. (2008) 6 pages.
Preu et al, "A new low-cost approach for passivated rear contact formation in crystalline silicon solar cell technology", 16th European Photoltaic Solar Energy Conference, May 1-5, 2000, Glasgow, United Kingdom, pp. 1181-1184.
Schneiderlochner et al., "Investigations on Laser-fired contacts for passivated rear solar cells", Photovoltaic Specialists Conference, 2002. Conference Record of the Twenty-Ninth IEEE, pp. 300-303 (2002).
Wood et al., "Laser processing for high-efficiency silicon solar cells", Fourteenth IEEE Photovoltaic Specialists Conference 1980 (Jan. 7-10, 1980) (Abstract).
Young et al., "Laser processing for high-efficiency Si solar cells", J. Appl. Phys. 53(2):1178-1189 (Feb. 1982).
Zhao et al. " 21.5% Efficient 47-µm thin-layer silicon cell". Proceedings of the 13th European Photovoltaic Solar Energy Conference (1995).
International Search Report and Written Opinion from corresponding PCT Application No. PCT/US2008/002048 mailed Jun. 25, 2008, 8 pages.
Supplementary European Search Report corresponding to European Application No. 08725658.2 dated Jan. 17, 2011, 9 pages.
Japanese Office Action with English translation from corresponding Japanese Patent Application No. 2009-549629, mailed Sep. 25, 2012, 8 pages.
Japanese Office Action with English translation from corresponding Japanese Patent Application No. 2013-061758, mailed Jan. 6, 2014, 9 pages.
Japanese Office Action with English translation from corresponding Japanese Patent Application No. 2009-549629, mailed Apr. 8, 2014, 7 pages.
Kluska et al., "Loss analysis of High Efficiency Back-Contact Back-Junction silicon solar Cells," 23rd European Photovoltaic Solar energy Conference and Exhibition, Sep. 1-5, 2008.
Meier et al., "Self-doping contacts to silicon using silver coated with a dopant source [for solar cells]," Photovoltaic Specialists Conference 2000, Conference Record of the Twenty-Eighth IEEE , pp. 69-74, 2000.
Japanese Office Action with English translation from corresponding Japanese Patent Application No. 2009-549629, mailed Jul. 30, 2013, 7 pages.
Lammert et al., "The interdigitated back contact solar cell: a silicon solar cell for use in concentrated sunlight", IEEE Transactions on electron devices, vol. ED-24, No. 4, pp. 337-342, 1977.
King et al, "Front and back surface fields for point-contact solar cells," Photovoltaic Specialists Conference, Las Vegas, NV, USA, Sep. 26-30, 1988, pp. 538-544.
European Search Report for European application No. 13176866.5 dated Jul. 13, 2015 (7 pages).
Chinese office action from Chinese application No. 201310013171.3 dated Sep. 1, 2015 (7 pages).

\* cited by examiner

SOLAR CELL STRUCTURES, PHOTOVOLTAIC PANELS AND CORRESPONDING PROCESSES

CROSS REFERENCE TO RELATED APPLICATIONS

This application is a continuation of U.S. patent application Ser. No. 13/474,425 filed on May 17, 2012, which is a continuation of U.S. patent application Ser. No. 12/070,371 filed Feb. 15, 2008 which claims priority to U.S. provisional patent application Ser. No. 60/902,006 filed Feb. 16, 2007 to Hieslmair, entitled "Photovoltaic Cell Structures, Solar Panels and Corresponding Processes," all of which are incorporated herein by reference.

FIELD OF THE INVENTION

The invention relates to photovoltaic cells, photovoltaic modules and processes for the formation of these devices. In particular, the invention relates to rear point contacted photovoltaic cells and corresponding modules. In addition, the invention relates to efficient processing steps for forming rear point connections.

BACKGROUND OF THE INVENTION

Various technologies are available for the formation of photovoltaic cells, e.g., solar cells. A majority of commercial photovoltaic cells are based on silicon. With non-renewable energy sources continuing to increase in price, there is continuing interest in alternative energy sources. Increased commercialization of alternative energy sources relies on increasing cost effectiveness through lower costs per energy unit, which can be achieved through improved efficiency of the energy source and/or through cost reduction for materials and processing.

Photovoltaic cells operate through the absorption of light to form electron-hole pairs. A semiconductor material can be conveniently used to absorb the light with a resulting charge separation. The electrons and holes are harvested at a voltage differential to perform useful work in an external circuit, either directly or following storage with an appropriate energy storage device.

SUMMARY OF THE INVENTION

In a first aspect, the invention pertains to a solar cell comprising a transparent front sheet, a semiconductor layer having a front surface and an opposite rear surface, a plurality of p-doped islands and n-doped islands extending from the rear surface of the semiconductor layer and at least two electrical interconnects. The semiconductor layer is secured in a position with its front surface oriented toward the transparent front sheet. Generally, one electrical interconnect provides electrical connections between a plurality of p-doped islands, and another electrical interconnect provides an electrical connection between a plurality of n-doped islands.

In another aspect, the invention pertains to a method for forming a doped semiconductor structure, the method comprising printing a plurality of deposits onto a surface of a semiconductor sheet with some of the deposits comprising p-dopants and other deposits comprising n-dopants. Generally, a dielectric covering is attached to the semiconductor sheet along the surface with selected openings exposing an underlying semiconductor surface through the dielectric covering. The printing can be performed through the openings.

In a further aspect, the invention pertains to a method for forming a doped semiconductor structure, the method comprising irradiating a first layer comprising dopants onto a surface of a semiconductor sheet, wherein a dielectric covering is attached to the semiconductor sheet along the surface with selected openings exposing an underlying semiconductor surface through the dielectric covering. The irradiating can be performed at locations corresponding to selected windows to form a doped contact at the irradiated location.

In additional aspects, the invention pertains to a method for selectively depositing dopant along a doped semiconductor structure. The method comprises inkjet printing a first ink comprising p-doped silica particles and a second ink comprising n-doped silica particles onto a silicon substrate. In general, the silica particles of each ink have an average primary particle size of no more than about 100 nm, and each ink has a concentration from about 0.1 to about 30 weight percent silica particles.

Moreover, the invention pertains to a photovoltaic module comprising a transparent front sheet and a solar cell comprising a semiconductor layer secured along the transparent front sheet with a front surface facing the transparent front sheet, a rear dielectric layer adhered to a rear surface of the semiconductor layer, doped domains located within openings through the rear dielectric layer, a first electrical interconnect electrically connecting a plurality of p-doped domains and a second electrical interconnect electrically connecting a plurality of n-doped domains wherein the electrical interconnects extend into the openings.

DETAILED DESCRIPTION OF THE INVENTION

Figure 1:
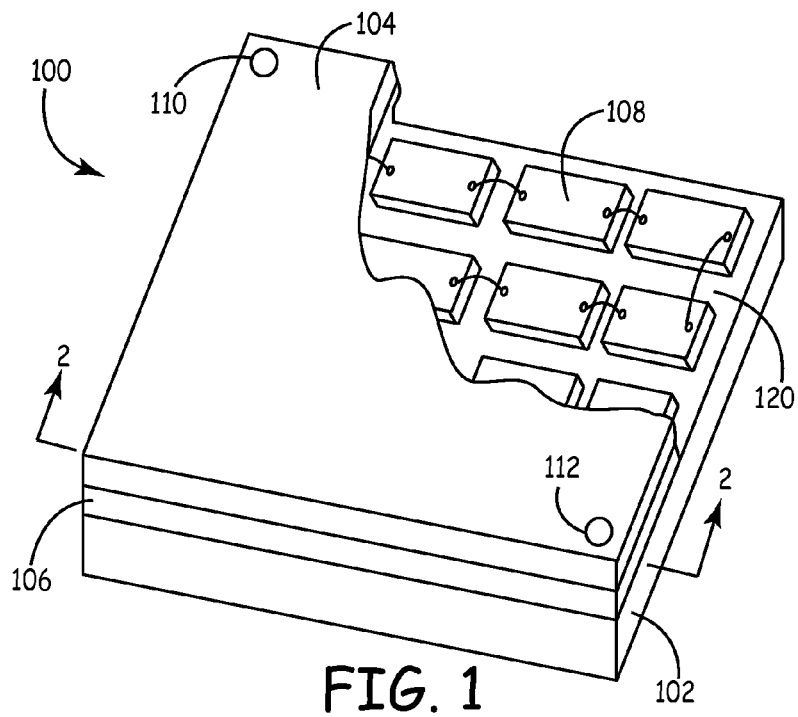
FIG. 1 is a schematic side perspective view of a photovoltaic module with a portion of the backing layer removed to expose some of the solar cells within the module.

Effective photovoltaic structures are formed efficiently with rear surface contacts to efficiently harvest electron-hole pairs across the area of the cell. In some embodiments, doped contacts are formed using deposition through openings or holes in a dielectric layer. Processes described herein can provide efficient approaches for the formation of solar cells with rear connections in which the cells are electrically connected within a photovoltaic module. The improved processes are suitable for thin semiconductor foil processing, although the approaches can also be adapted to thicker semiconductor layer processing. Some of the processing improvements are particularly suitable for module level processing of a plurality of cells simultaneously. The doping approaches herein are particularly suitable for the formation of dopant structures that form a portion of photovoltaic contacts for photo-current harvesting from a semiconductor substrate.

Photovoltaic modules generally comprise a transparent front sheet that is exposed to sunlight during use of the module. The solar cells, i.e., photovoltaic cells, within the photovoltaic module can be placed adjacent to the transparent front sheet such that light transmitted through the transparent front sheet can be absorbed by a semiconductor material in the solar cell. The transparent front sheet can provide support, physical protection as well as protection from environmental contaminants and the like. The photovoltaic cells are generally connected in series to increase the available voltage of the module. A photovoltaic module can comprise sets of connected parallel photovoltaic cells along with the sets of cells connected in series. The active material of a photovoltaic cell is generally a semiconductor. Following absorption of light, photocurrent can be harvested from the conduction band to perform useful work through connection to an external circuit. For a photovoltaic cell, improved performance can be related to increased energy conversion efficiency for a given light fluence and/or to lowering the cost of producing a cell.

Doped contact regions interfacing with the semiconductor material facilitate the harvesting of the photocurrent. In particular, electronic and holes can segregate to the respective n+-doped and p+-doped regions. The doped contact regions interface with electrical conductors to form current collectors to harvest the photocurrent formed by absorbing light to generate a potential between the two poles of the contacts. Within a single cell, the doped contact regions of like polarity are connected to a common current collector such that the two current collectors associated with the different polarity of doped contacts form the counter electrodes of the photovoltaic cell.

While the voltages are additive for solar cells connected in series, the current of the series of cells depends on the performance of the individual solar cells. In particular, the current through the series of cells is essentially the current capability of the poorest current delivering solar cell in the series since the weakest solar cell cannot support a higher current at a common illumination level. Power available from higher performing cells is lost by trying to push current through the lower performing cells. The power from series connected solar cells is the product of the current times the voltage of the unit. The current of a particular cell can be a function of the carrier lifetime, which is related to the efficiency for harvesting current from populated conduction bands upon absorption of light. Generally, the efficiency of the cell is also related to the design of the cell, for example, with respect to division of the cell into p+-doped and n+-doped regions and placement of the doped regions.

In some embodiments, the size of the individual cells can be selected based on measured properties of the semiconductor material that is formed into the photovoltaic cells. Thus, the collection of cells for a module can be sized to have significantly smaller differences in current capabilities. This can be particularly convenient when the individual cells are divided on or cut from a larger sheet so that the area of the sheet can be effectively and appropriately divided. In particular, a semiconductor sheet can be evaluated to estimate minority carrier lifetime, which is a primary determinant of performance, at selected locations along the surface of the semiconductor. Furthermore, the dopant placement as well as the size and/or dopant levels of individual doped contacts can be also selected if desired based on measurements relating to the semiconductor properties. An inkjet process introduces a great level of flexibility to the processing of the doped contact regions. Specifically, the doping process can be dynamically adjusted in a straightforward way for a particular semiconductor sheet. A further description of real time processing for cell division and/or dopant placement is described further in copending U.S. patent application Ser. No. 12/070,381 now published U.S. patent application 2008/0202577 to Hieslmair et al. filed on the same day as the present application, entitled "Dynamic Design of Solar Cell Structures, Photovoltaic Modules and Corresponding Processes," incorporated herein by reference.

The placement of dopant contact regions within a cell influences performance of a cell. In particular, the spacing and size of p+-doped regions with respect to n+-doped regions can influence cell performance. Similarly, the area attributed to doped contact regions, i.e., p+-doped and n+-doped regions influences cell performance. Thus, the number and/or placement and/or size of n+-doped regions and p+-doped regions can be selected to improve current generation efficiency of an individual cell. The processing approach generally can also influence the placement and size of the doped regions at least with respect to available ranges.

In embodiments of particular interest, the photovoltaic module comprises a silicon, germanium or silicon-germanium alloy material that is used for the semiconductor sheet. For simplicity of discussion, the reference herein to silicon implicitly refers to silicon, germanium, silicon-germanium alloys and blends thereof, unless indicated otherwise in context. In the claims, silicon/germanium refers to silicon, germanium, silicon-germanium alloys and blends thereof. The semiconductor sheets generally can be doped, although the overall dopant levels across the semiconductor layer are less than the dopant levels of appropriate corresponding doped contacts. In the following, embodiments based on polycrystalline silicon are discussed in more detail, although appropriate portions can be generalized for other semiconductor systems based on the disclosure herein. Furthermore, thin silicon foils can be suitable for processing approaches herein in which the foils have a thickness form about 5 microns to about 100 microns. The formation of these thin foils is made possible as a result of revolutionary process approaches.

The formation of thin foils of crystalline silicon, such as polycrystalline silicon, is described further in copending U.S. patent application Ser. No. 11/717,605 filed on Mar. 13, 2007, now U.S. published patent application U.S. 2007/0212150 to Hieslmair et al., entitled "Thin Silicon or Germanium Sheets and Photovoltaics Formed From Thin Sheets," and U.S. provisional patent application Ser. No. 61/062,398 to Hieslmair et al., filed on Jan. 25, 2008, entitled "Deposition onto a Release Layer for Synthesizing Inorganic Foils," both of which are incorporated herein by reference. The thin foils of silicon can be formed using a light driven deposition process referred to as light reactive deposition. Light reactive deposition is described further in copending U.S. patent application Ser. No. 09/715,935 to Bi et al., entitled "Coating Formation By Reactive Deposition," publication number 2003/0228415A to Bi et al., entitled "Coating Formation By Reactive Deposition," and publication number 2006/0134347A to Chiruvolu et al., entitled "Dense Coating Formation By Reactive Deposition," incorporated herein by reference.

With the use of thin semiconductor layers formed using a sacrificial, release layer, the exposed surface can be cleaned, textured and/or otherwise prepared and then the thin layer can be separated from an underlying substrate directly onto a transparent front sheet. In some embodiments, the semiconductor layer is subsequently cut into cells while the sheet of semiconductor is fixed on the transparent front sheet. Then, the front surface of the cut photovoltaic cell is positioned at its ultimate location on the transparent front sheet without any need to transfer the cell. With the semiconductor structure for the cell in position on the transparent front sheet, additional processing can be performed on the back side of the cell until the cells are completed and integrated into the module.

Metal or other electrically conducting material connects to the doped semiconductor regions as a current collector within a cell. The current collectors of adjacent cells can be joined with electrical connections to connect the cells in series. The end cells in the series can be connected to an outside circuit to power selected applications or to charge an electrical storage device, such as a rechargeable battery. The photovoltaic module can be mounted on a suitable frame.

In general, a photovoltaic cell comprises a photoconducting semiconductor structure with a front surface designed for receiving light. The front surface may have an antireflective coating and/or a texture or the like. The front surface generally is designed for placement adjacent a transparent layer, such as a silica glass layer, within a photovoltaic module. The rear surface of the cell faces away from the transparent front sheet, and generally provides for at least some of the electrical connections to the cell. The module generally can have a rear seal, which may function together with a front transparent material and/or frame, to protect the solar cells in the photovoltaic module from moisture and other environmental contaminants. Appropriate electrical connections extend from the sealed module.

Various contact structures have been designed for photovoltaic cells. For example, doped regions can be placed on the front surface of a cell. Generally, any front placed doped regions need to be in electrical contact with a current collector that extends to connect the contact with the opposite pole of an adjacent cell for a series connection or to an external circuit. Some cells have one type of doped region on the front surface and a second type of doped region on the rear surface. In embodiments of particular interest herein, each cell has doped regions of opposite polarity along the rear or back of the cell. Placement of the doped regions on the rear surface provides convenient processing while the front surface is supported on a transparent front sheet. For rear connected solar cells, the front surface can be free of structures that may interfere with access to irradiation of the semiconductor material with light.

The semiconductor doped regions can be formed as doped domains along the semiconducting material, in which the doped domains can extend into the semiconductor material and/or extend from the surface of the semiconductor material. P+-doped regions generally comprise an electron deficient dopant, such as B, Al, Ga, In or combinations thereof. N+-doped regions generally comprise an electron rich dopant, such as P, As, Sb, or combinations thereof. The p+-doped regions form the cell anode (emitter), and the n+-doped regions form the cell cathode (collector). In some embodiments, the rear side of the cell has a plurality of p+-doped regions and a plurality of n+-doped regions.

Electrically conductive elements connect emitters (anode) of one cell with collectors (cathode) of another cell in the module to form a set of series connected cells. The current collectors of the end cells of the series are connected to an external circuit when the cell is in use.

In some embodiments, the front and/or rear sides of the semiconducting material can comprise a passivation layer that is electrically insulating. Suitable materials to form passivation layers include, for example, stoichiometric and non stoichiometric silicon oxides, silicon nitrides, and silicon oxynitrides, with or without hydrogen additions. Specifically, passivation layers can comprise, for example, $SiN_xO_y$, $x \leq 4/3$ and $y \leq 2$, silicon oxide ($SiO_2$), silicon nitride ($Si_3N_4$), silicon rich oxide ($SiO_x$, $x<2$), or silicon rich nitride ($SiN_x$, $x<4/3$). These passivation layers protect the semiconductor material from environmental degradation, reduce surface recombination of holes and electrons as well as provide anti-reflecting properties for front surfaces. As described below, a process is described to deliver the dopant materials through a passivation layer.

In some embodiments, a plurality of solar cells is cut from a larger sheet of semiconductor material. Generally, any reasonable cutting approach can be used. For example, mechanical cutting, fluid jet cutting or radiation based cutting can be used to cut the larger sheet. In some embodiments, radiation-based cutting, such as with a laser, can be effectively used to make sharp divisions to form individual cells. The semiconductor sheet can be supported on a substrate during the cutting process. It can be particularly desirable to support the semiconductor sheet for embodiments in which the semiconductor is a thin foil, such that the cut sections are less likely to suffer damage in handling.

The cut segments may or may not be repositioned with respect to placement within a photovoltaic module. In other words, in some embodiments, the original semiconductor sheet can be selected to provide the semiconductor structure for a photovoltaic module or a selected portion thereof, and the semiconductor sheet is then subdivided into individual cell through the cutting process. For example, the semiconductor sheet or a plurality of semiconductor sheets, can be secured to the transparent front sheet of the module for cutting such that the cut cells structures are appropriately positioned for further processing into the complete module without changing the position of the semiconductor material on the transparent front sheet. In alternative embodiments, the cut semiconductor sections cut form a single sheet can be separately assembled into a plurality of modules, such as one portion of segments being assembled into a first module and another portion of segments being assembled into a second module. In further embodiments, the cut segments can be assembled with segments cut from one or more other semiconductor sheets into a single module, or the cut segments can be combined with cut segments from other semiconductor sheets for assembly into multiple modules.

In general, dopants can be applied in any reasonable process to the semiconductor materials to form doped contacts. For example, a liquid composition comprising a dopant element can be deposited for incorporation into the semiconductor. Alternatively, approaches have been described for obtaining dopants from doped silicon oxide particles to transfer to a silicon substrate. In further embodiments, doped silicon particles can be used to form doped silicon domains associated with the semiconductor sheet. These approaches are discussed further below in the context of printing approaches for the doping of thin silicon/germanium foils.

For the deposition of dopants for photovoltaics, the resolution generally is intermediate in the sense of having a micron scale resolution; but not on the even smaller scale of current integrated circuit components. Thus, inkjet printing, other printing approaches or the like can be convenient to deposit a liquid dopant composition at select locations along the cell, such as along the rear or backside of the cell, to provide dopant atoms to subsequently form the respective n+-doped and p+-doped domains. While conventional inkjet heads can be adapted for this use, redesigned print heads for the specific application can similarly be used to deliver desired volumes of liquid from a reservoir at selected locations. In addition to printing approaches, a layer of dopant comprising a dopant can be deposited, and a laser or other radiation beam can be used to fix the dopant at selected locations to form the doped contact at the location. Inks can be used to form the layer.

In general, any composition suitable for delivering dopant atoms in an ink form can be incorporated into the ink. Dopant inks are considered broadly as a liquid composition capable of providing the desired dopant elements. In particular, nanoscale particles dispersed at relatively high concentrations can be used in dopant inks. Dopant inks can comprise particles with selected compositions to deliver desired dopants at desired concentrations. For example, highly doped silica particles and/or silicon particles can provide the dopants without introducing any significant quantities of contaminants with respect to silicon-based semiconductor sheets. In other embodiments, dopant inks can comprise non-particulate dopant compositions.

In general, the inks can comprise a suitable liquid to form dispersions of the particles. Suitable liquids to disperse metal oxide and metalloid oxide particles generally can comprise water, alcohols, other organic solvents and mixtures thereof. Other liquids to disperse silicon particles are described below. The dispersions can have concentrations from low concentrations to about 50 weight percent or greater. Well dispersed particles can have a reasonably small secondary particle size indicating that the particles are not highly agglomerated in the dispersion.

In appropriate embodiments, the doped particles for forming the inks can be synthesized through any reasonable process, such as flame pyrolysis, solution based methods or the like. However, highly doped particles can be produced with desirable properties, for example, using laser pyrolysis, which is a convenient and versatile approach for the synthesis of highly uniform submicron particles with a range of selectable dopants. In particular, by appropriately selecting the composition in the reactant stream and the processing conditions, submicron particles incorporating the desired metal/metalloid composition stoichiometry optionally with selected dopants can be formed. While in principle a range of doped particles are suitable, doped submicron particles or nanoparticles having an average primary particle diameter no more than about 500 nm are desirable due to their ability to form good dispersions. In some embodiments, the doped particles comprise Si, Ge, $SiO_2$, $GeO_2$, combinations thereof, alloys thereof or mixtures thereof. Doped particles may be surface modified with associated compositions to stabilize particle dispersions. In general, any reasonable combination of processing approaches can be adapted for dopant placement with respect to selected dopant locations on the semiconductor substrate.

The final cell structure can include other layers in addition to a transparent front sheet, a semiconductor sheet, current collectors and dopant regions. These additional layers can include, for example, adhesive layers, dielectric layers, anti-reflective layers, protective layers and the like. General approaches are described further below for general placement of dopant and contact structures. However, a more detailed description is provided for a particular embodiment relating to a silicon foil semiconductor in which dopants are deposited along the rear surface and all contacts are correspondingly placed along the rear surface of the cell.

In some embodiments, for the formation of a rear contact solar cell, efficient processing can be achieved from the deposition of a passivation, dielectric layer onto the semiconductor rear surface prior to introducing the doped contacts in association with the semiconductor layer. Then, portions of the passivation layer can be removed to expose the semiconductor surface to allow for contact with the dopant. Openings/holes can be placed through the passivation layer, for example, using a laser or the like, although other approaches, such as mechanical drilling or etching can be alternative or additional approaches. Laser drilling or other approaches can be controlled to expose the semiconductor surface without significantly damaging the semiconductor surface. The size of the holes, the number of holes and/or placement of the holes can be selected to yield desired degrees of doping and cell performance.

In some embodiments, patterned layered structures can be used to form desired current collector configurations. The use of lithography, photolithography or the like can be adapted to form the layered current collector structures. However, printing approaches can also be used to form current collectors which are consistent with efficient and rapid processing approaches. In general, the use of a reasonably large number of dopant domains can be desirable since then the p-doped and n-doped regions can have a shorter distance to an adjacent doped region. If adjacent doped regions are close to each other more efficient harvesting of the photocurrent can take place.

After a dopant ink is deposited at selected positions along the semiconductor surface, the dopants can be further processed to form the doped contact. For dopant compositions and doped silicon oxide particles, the dopants generally are driven into the layer of semiconductor material at the deposited locations, such as through heating of the structure in an oven to mobilize the dopants, which then migrate into the semiconductor material. The diffusion of the dopant atoms depends on the time and diffusion conditions. In general, the oven based approach is relatively slow and tends to drive the dopants relatively deeply into the semiconductor material in order to obtain desired levels of dopant within the semiconductor.

Alternatively or additionally, dopants can be driven into the semiconductor using an intense light source. For example, a laser beam can be pulsed onto the surface to melt a very thin layer along the surface to form a shallow doped region, although deep doped regions can be used in some embodiments. In particular, a laser can provide an intense pulse over a relatively large area to process the dopant into the surface. Generally, suitable lasers can emit light with wavelengths ranging from infrared to ultraviolet. The pulsing of the laser can be repeated to achieve the desired level of dopant drive into the surface. If silicon oxide particles are used to provide the dopant atoms, after the dopant is driven into the semiconductor, the remnants of the particles from the dopant ink can be removed from the surface through an appropriate etching process. In some embodiments, this can be done without removing the passivation layer.

For embodiments in which silicon particles are used to deliver the dopant atoms to the doped regions, the silicon particles can be fused at the location to directly form the doped regions. Some dopant may or may not diffuse into the underlying silicon sheet during this fusing process. Thus, the resulting doped contact region can be in the form of a thin island on top of the semiconductor sheet and/or within the surface of the semiconductor sheet. In either case, efficient harvesting of the photocurrent can take place since a thin doped contact over the semiconductor sheet can perform similarly to a contact within the semiconductor sheet.

Once the p+-doped regions and n+-doped regions are formed through appropriate doping, the doped regions of like polarity are connected to respective current collectors. In appropriate embodiments, the holes through the passivation layer can be used to form the electrical connection with the doped domains. Various approaches can be used to deposit the current collector material. For example, the current collector can be formed using a silver ink that is deposited at the appropriate locations, such as with an inkjet or screen printing. Suitable commercial silver inks include, for example, DowCorning® Brand highly conductive silver inks and conductive silver ink 2512 from Metech, Elverson, Pa. Alternatively or additionally, physical vapor deposition or the like can be used to deposit the current collector material. Following deposition of the current collector material, the structure can be heated to crosslink, fuse and/or anneal the current collector material if appropriate. In some embodiments, a seed layer can be deposited for the current collector and electrochemical deposition is used to complete the current collector formation.

The current collectors generally should be connected to link adjacent cells in series. To accomplish this objective, the current collector material can be deposited in a configuration that extends to connect the cells over an electrically resistive bridge or the like and/or additional wiring or the like can be used to connect the current collectors of adjacent cells. An adhesive and/or backing material can be placed over the cell rear surface to protect the rear surface and to facilitate handling. Specifically, a backing structure, such as a polymer sheet can be placed over the entire back and/or sides of the module. The cell module can be placed into an appropriate frame either before or after placement of a backing material or the like. Electrical leads for positive and negative poles should be accessible for connection to an external circuit following completion of the module, although leads can be covered or otherwise protected for shipping and/or storage.

The rear semiconductor doped region structure described herein is well suited for the improved processing approaches as well as for placement on the thin semiconductor substrate that can be used to form the cell structure. Generally, a thin semiconductor layer is supported on a substrate during processing. The processing approaches with rear side doped regions reduce the need to transfer the thin semiconductor material to reduce processing steps and reduce the chances of damaging the thin semiconductor structure.

Module and Cell Structures

The photovoltaic modules generally have a transparent front sheet and a protective backing layer with the solar cells between the transparent front sheet and the protective backing layer. A plurality of solar cells generally is connected in series within a photovoltaic module. The semiconductor structure of the photovoltaic cell can be a thin silicon foil, although the processing approaches herein can be applied for other semiconductor materials and formats. Each cell generally has a plurality of doped domains to form the contacts for the two polarity current collectors of the cell. Generally, the solar cells can be rear or back surface contact solar cells, although other contact structures can be adopted in further embodiments. High cell performance can be expected from the structures described herein.

Figure 2:
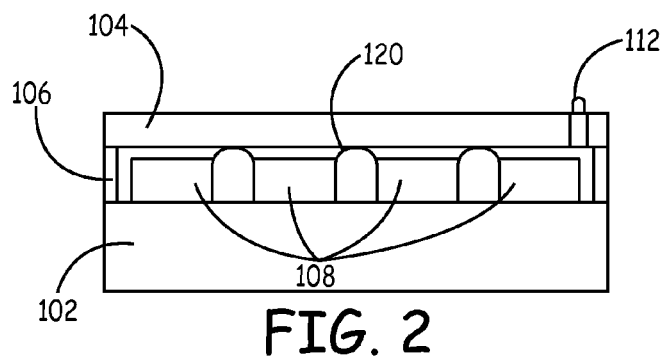
FIG. 2 is a sectional side view of the photovoltaic module of FIG. 1 taken along line 2-2 of FIG. 1.

A schematic view of a photovoltaic module is shown in FIG. 1. Photovoltaic module 100 can comprise a transparent front sheet 102, a protective backing layer 104, a protective seal 106, a plurality of photovoltaic cells 108 and terminals 110, 112. A sectional view is shown in FIG. 2. Transparent front sheet 102 can be a sheet of silica glass or other suitable material that is transparent to appropriate sun light wavelengths and provides a reasonable barrier to environmental assaults such as moisture. Suitable materials for the module components are discussed in more detail in the following section. Backing layer 104 can be any suitable material that provides protection and reasonable handling of the module at an appropriate cost. Backing layer 104 does not need to be transparent and in some embodiments can be reflective to reflect the light that transmitted through the semiconductor back through the semiconductor layer where a portion of the reflected light can be adsorbed. Protective seal 106 can form a seal between front protective sheet 102 and protective backing layer 104. In some embodiments, a single material, such as a heat sealable polymer film, can be used to form backing layer 104 and seal 106 as a unitary structure.

Solar cells 108 are placed with their front surface against transparent front sheet 102 so that solar light can reach the semiconductor material of the photovoltaic cells. Solar cells can be connected electrically in series using current collectors 120, conductive wires or the like. End cells in the series can be connected respectively to terminals 110, 112 that provide for connection of the module to an external circuit. In some embodiments, some solar cells can be connected in parallel to increase the current with an offsetting decrease in voltage, and/or sets of series connected photovoltaic cells can be connected to separate terminal associated with a large module if each series of cells generates an appropriate amount of voltage. Furthermore, the average size of each photovoltaic cell can be adjusted to achieve desired module properties. For example, the formation of a module with fewer, larger cells connected in series generate a relatively larger amount of current at a lower voltage relative to a larger number of smaller cells over the same module footprint. The voltage from the series of cells is determined by adding the individual voltages of the individual series connected cells.

A particular intended application generally influences the selection of module size. For example, potential applications range from small individual external lights to solar panels for a residential house to panels for a commercial scale electricity generation facility. Reasonable module sizes may range, for example, from four square centimeters ($cm^2$) or less to several square meters or larger. Once the overall size is selected for a module, the average individual cell sizes can be selected to balance current versus voltage as well as processing considerations and material considerations. The processing approaches herein can be adapted for any of these selected embodiments with appropriate corresponding equipment design. In some embodiments, the module comprises at least 10 cells, in further embodiments at least 20 cells and in additional embodiments from about 24 cells to about 200 cells. A person of ordinary skill in the art will recognize that additional ranges of cell number within the explicit ranges above are contemplated and are within the present disclosure.

Figure 3:
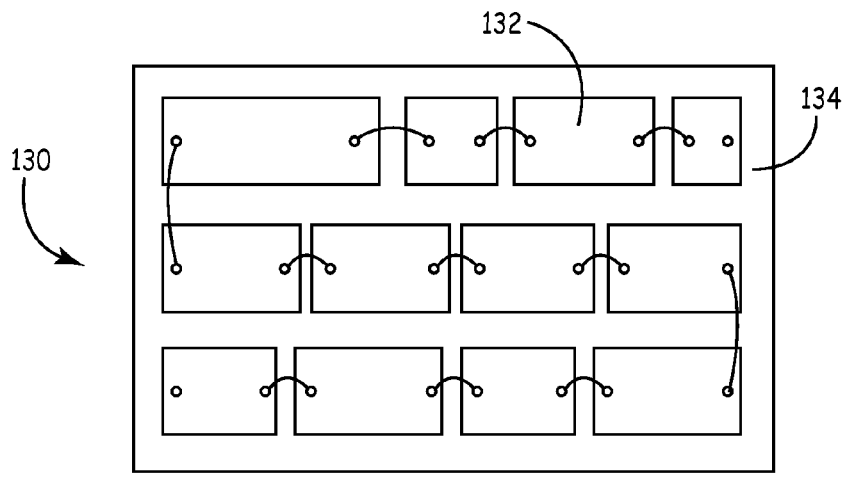
FIG. 3 is a bottom view of a photovoltaic module with the backing layer removed to expose the solar cells within the module.

A bottom view of an embodiment of a photovoltaic module 130 is shown in FIG. 3 with the backing layer removed. In this embodiment, photovoltaic cells 132 with different areas are mounted on transparent front sheet 134. In some embodiments, an entire collection of cells in a module is cut from a single large semiconductor sheet, or a set of cells of the module is cut from a single semiconductor sheet. Dynamic cell cutting and doping processes can allow for efficient selection of cells with areas better matched for current generation. As shown in FIG. 3, the plurality of cells is cut with approximately the same cell width while the cell lengths are selected to adjust current generation of the cell to a selected value. Dynamic cell division to improve module performance is discussed further in copending U.S. patent application Ser. No. 12/070,381 filed on the same date as the present application to Hielsmair et al. now U.S. published patent application 2008/0202577, entitled "Dynamic Design of Solar Cell Structures, Photovoltaic Modules and Corresponding Processes," incorporated herein by reference.

Figure 4:
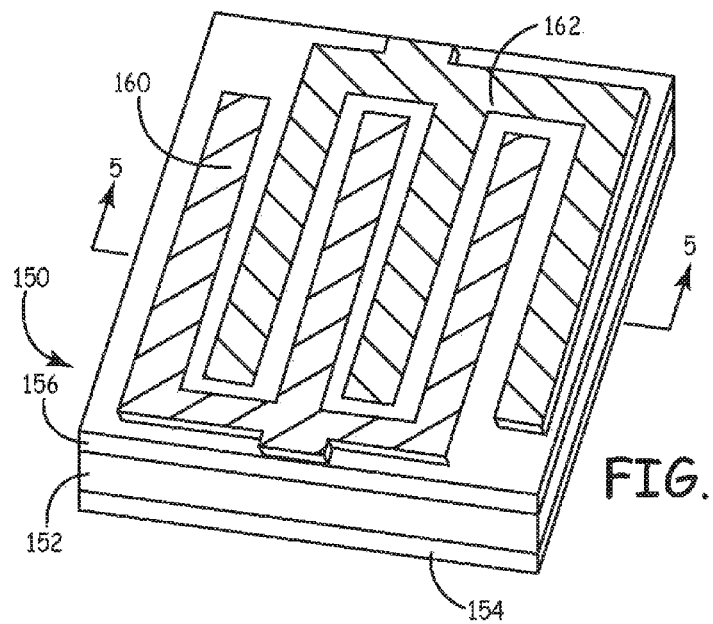
FIG. 4 is a bottom perspective view of an individual solar cell.
Figure 5:
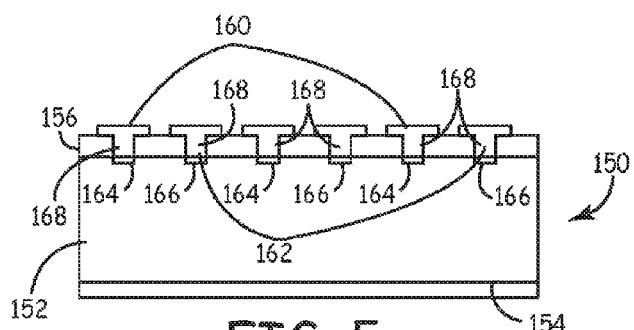
FIG. 5 is a sectional view of the solar cell of FIG. 5 taken along line 5-5 of FIG. 4.

Referring to FIGS. 4 and 5, an embodiment of an individual photovoltaic cell is shown. In some embodiments, photovoltaic cell 150 can comprise a semiconductor layer 152, a front surface passivation layer 154, a rear surface passivation layer 156, negative contact or collector 160, and positive contact or emitter 162. Collector 160 generally is in electrical contact with n+-doped regions 164, as shown in the cross sectional view in FIG. 5. Emitter 162 generally is in electrical contact with p+-doped regions 166, as shown in FIG. 5. Doped regions 164, 166 can be positioned below holes 168 in passivation layer 156, and holes 168 can be filed with current collector material to make electrical contact with doped regions 164, 166.

Figure 6A:
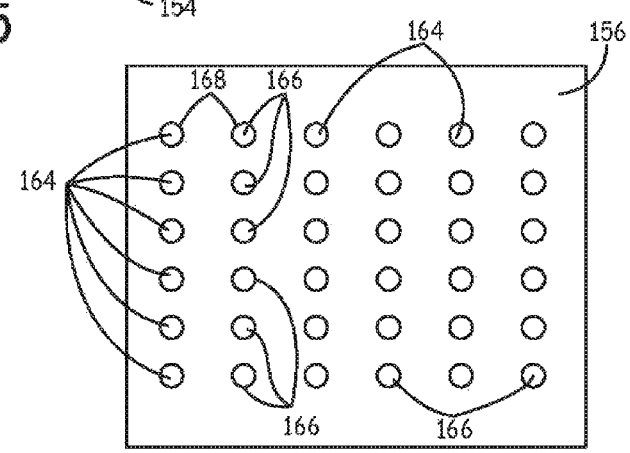
FIG. 6A is a bottom view of a semiconductor substrate with the current collectors removed to expose dopant domains through holes drilled through a passivation layer.

A bottom view is shown in FIG. 6A of the solar cell with the current collector material removed. In general, doped regions and corresponding holes or openings through the passivation layer can have any reasonable shape that separates the different poles of the cell. For example, the holes/openings through the passivation layer can have generally cylindrical shapes, groove shapes or other desired shapes. Roughly cylindrical holes can be formed conveniently using the processes described herein. For example, the holes can be formed by laser drilling. Similarly, openings shaped as grooves can be formed by appropriately moving a laser beam between pulses. If a greater amount of passivation material is removed, the corresponding size of the doped regions increases. Thus, if more passivation material is removed, contact resistance may decrease but surface recombination of holes and electrons may increase so that a balance between these effects can influence cell design.

In general, the holes can have average diameters, with averages over different holes as well as over non-circular shapes, ranging from about 5 microns to about 100 microns and in further embodiments from about 10 microns to about 30 microns. The spacing of the holes can be from about 50 microns to about 500 microns and in further embodiments from about 80 microns to about 240 microns. A person of ordinary skill in the art will recognize that additional ranges of hole dimensions and spacing within the explicit ranges above are contemplated and are within the present disclosure.

Alternating rows are visible of n+-doped regions 164 and p+-doped regions 166 within holes 168 through layer 156. To simplify the diagram, only two rows are labeled with reference numbers 164, 166, but it is clear how these contacts line up with current collector strips in FIG. 4 so that n+-doped regions are in electrical contact with negative current collector 160, and p+-doped regions are in electrical contact with the positive current collector 162. Similarly, only two example holes are labeled in the figure, although each doped region is associated with a hole. While the holes are shown in a rectangular grid in FIG. 4, the hole placement can be performed based on semiconductor property measurements across the surface such that the hole placement is dynamically determined for a particular structure with placement constrained by the ability to form appropriate current collectors.

Figure 6B:
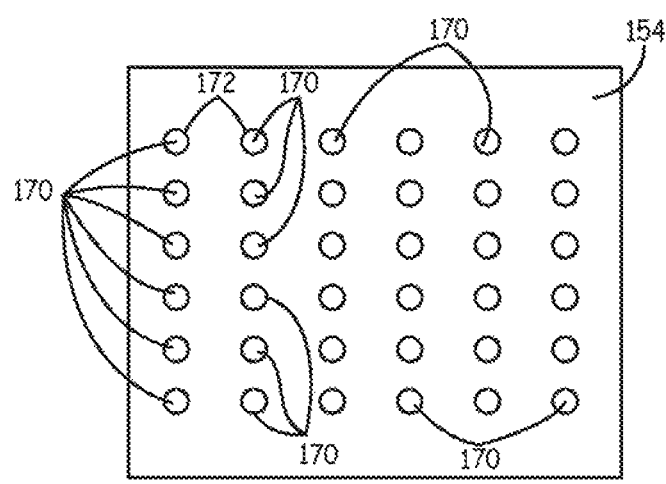
FIG. 6B is a top view of a semiconductor substrate with the current collectors removed to expose dopant domains through holes drilled through a passivation layer.
Figure 7:
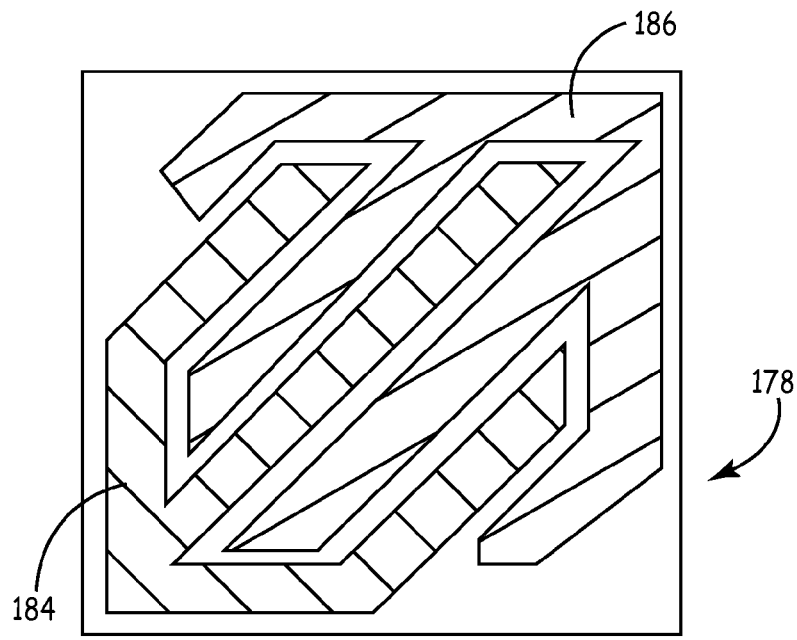
FIG. 7 is a bottom view of an alternative embodiment of a solar cell.
Figure 8:
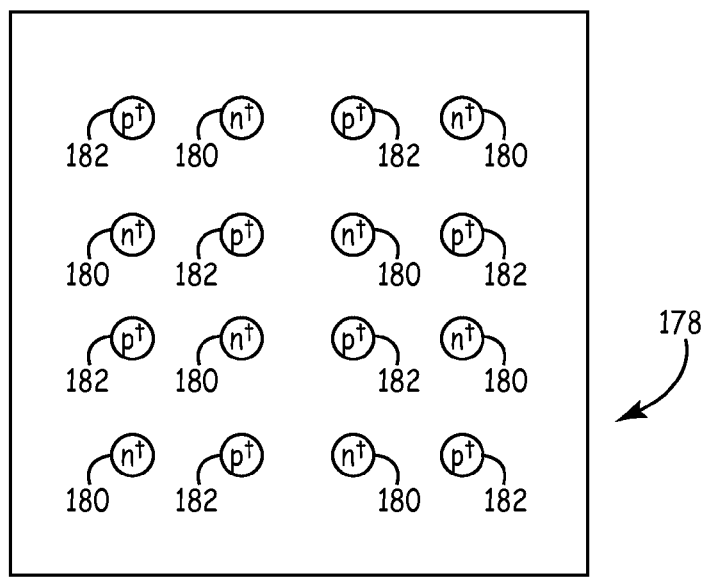
FIG. 8 is a bottom view of the solar cell of FIG. 7 prior to application with the current collectors removed to expose dopant domains within holes through a passivation layer.

An alternative embodiment of a solar cell is shown in FIGS. 7 and 8. In this embodiment, photovoltaic cell 178 has n+-doped regions 180 and p+-doped regions 182 that are arranged in a checkerboard fashion, as shown in FIG. 8. Negative contact 184 and positive contact 186 are correspondingly aligned in angled stripes as shown in FIG. 7. Then, negative contact 184 is in electrical contact with n+-doped regions 180, and positive contact 186 is in electrical contact with p+-doped regions 182. While FIGS. 6 and 8 depict geometrically arranged contacts, the dynamic selection of contact placement can involve less symmetric placement of the contacts, as described further below.

The structure in FIG. 7 has the current collector material for the two poles deposited as a common level on the structure. For a rear contact photovoltaic cell, two layer current collector structures with an insulating layer separating the opposite polarity electrodes have been described. See, U.S. Pat. No. 4,927,770 to Swanson, entitled "Method of Fabricating Back Surface Point Contact Solar Cells," and U.S. Pat. No. 6,423,568 to Verlinden et al., entitled "Method of Fabricating a Silicon Solar Cell," both of which are incorporated herein by reference. While the two layer current collector structure can be incorporated into the structures described herein, a two layered structure would add processing steps.

Regardless of the configuration of the metal fingers, the metal fingers and associated metal surface can be designed to cover as much area as practical without having the opposite poles touching since the metal also functions as a rear light reflector. Thus, the finger width can be approximately at least about 40 percent of the finger pitch, i.e., spacing between centers of the fingers, and in further embodiments at least about 50 percent of the finger pitch and in additional embodiments from about 60 to about 85 percent of the finger pitch. A person of ordinary skill in the art will recognize that additional ranges of finger pitch within these explicit ranges are contemplated and are within the present disclosure.

The discussion above focuses on thin film semiconductor solar cells with rear contacts. However, some of the processing procedures herein can be applied for other cell configurations. For example, thin film solar cells with a combination of front and rear contacts are described further in U.S. Pat. No. 6,455,347 to Hiraishi et al., entitled "Method of Fabricating Thin-Film Photovoltaic Module," incorporated herein by reference. Another representative photovoltaic module structure with front contacts and rear contacts is described in U.S. Pat. No. 5,956,572 to Kidoguchi et al., entitled "Method of Fabricating Integrated Thin Film Solar Cells," incorporated herein by reference. Some processes described herein can be adapted for processing cells with both front contacts and rear contacts based on the teachings herein. A corresponding view to FIG. 6A of a front surface of the semiconductor sheet with front contacts is shown in FIG. 6B, in which rows are visible of doped regions 170 within holes 172 through layer 154. For these embodiments, the dynamic cutting of the cells can be performed prior to the transfer of the semiconductor sheet to the transparent front sheet such that the front surface of the semiconductor layer can be processed with respect to placement of the front surface contacts prior to securing the cells to the transparent front surface. After securing the cells to the transparent substrate, the remainder of the processing can be performed with respect to the rear surface.

Materials for Photovoltaic Assemblies

Examples of suitable materials for incorporation into the photovoltaic modules are described in the following. The transparent front sheet can be, for example, a silica glass, other inorganic glass material, a transparent polymer material, composites thereof or the like. The transparent front sheet can have an antireflective coating or other optical coating one or both surfaces. Suitable polymeric backing layers include, for example, Tedlar® "S" type, a polyvinyl fluoride film, from DuPont. With respect to reflective materials, the polymer sheet for the backing layer can be coated with a thin metal film, such as metalized Mylar® polyester film. A protective seal joining the transparent front sheet and a backing layer can be formed from an adhesive, a natural or synthetic rubber or other polymer or the like.

In general, any reasonable semiconductor material useful for solar cells can be processed as described herein if the material can be formed into sheets that can be appropriately cut into selected cell sizes. However, polycrystalline silicon provides desired levels of performance while having reasonably cost materials available for forming large area semiconductor sheets that can be cut into individual solar cells. In particular, suitable semiconducting material includes, for example, thin foils of polycrystalline silicon.

Thin foils of silicon or other inorganic semiconductors can be formed on a sacrificial release layer. In some embodiments, the release layer is mechanically weak so that the release layer can be fractured without damage to the silicon layer on top of the release layer. The formation of thin sheets of silicon by Light Reactive Deposition (LRD™) is described further in published U.S. patent application 2007/0212510A to Hieslmair et al., filed on Mar. 13, 2007, entitled "Thin Silicon or Germanium Sheets and Photovoltaics Formed From Thin Sheets," incorporated herein by reference. Similarly, the thin films of silicon on a release layer can be formed using a chemical vapor deposition (CVD) approach onto a porous release layer at an atmospheric or sub-atmospheric pressure. The CVD process onto a porous release layer is described further in U.S. provisional patent application Ser. No. 61/062,398 to Hieslmair et al., filed on Jan. 25, 2008, entitled "Deposition Onto a Release Layer for Synthesizing Inorganic Foils," incorporated herein by reference. The properties of the silicon foils can be improved through an efficient zone melt recrystallization process designed for use with thin foils on a release layer as described further in copending U.S. provisional patent application Ser. No. 61/062,420 filed on Jan. 25, 2008 to Hielsmair et al., entitled "Zone Melt Recrystallization for Thin Silicon Films," incorporated herein by reference.

The use of a thin silicon sheets reduces material usage while promising good cell performance. Thin silicon sheets generally have thicknesses of no more than about 250 microns. In some embodiments, the thin silicon foils can have a thickness of no more than about 100 microns, in further embodiments from about 5 micron to about 100 microns, in other embodiments from about 10 microns to about 80 microns and in further embodiments from about 30 microns to about 60 microns and any subrange within these ranges. A person of ordinary skill in the art will recognize that additional ranges of foil thickness within the explicit ranges are contemplated and are within the present disclosure. With the use of thin semiconductor foils formed using a sacrificial, release layer, the top surface can be cleaned, textured, coated and/or otherwise prepared and then the thin foil can be separated from an underlying substrate directly onto a transparent substrate. In some embodiments, one or more additional layers, such as a passivation layer, can be deposited over and/or under the silicon layer.

The silicon foil can be transferred to the transparent front sheet, for example, using an adhesive composition to adhere the silicon foil or using electrostatic interaction. Suitable adhesives include, for example, silicone adhesives or EVA adhesives. Other reasonable adhesives can be used for other uses in photovoltaic module assembly, such as the adherence of a backing material, attachment to a frame, forming seals within the structure and the like. Other polymers, such as rubbers can be also used in forming seals. Processes and apparatuses for the transfer of thin inorganic foils to receiving surfaces is described further in copending U.S. provisional patent application Ser. No. 61/062,399 filed on Jan. 25, 2008 to Mosso et al., entitled "Layer Transfer for Large Area Inorganic Foils," incorporated herein by reference.

In some embodiments, the front and rear sides of the semiconducting layer can comprise a passivation layer that is electrically insulating. Suitable materials to form passivation layers include, for example, stoichiometric and non-stoichiometric silicon oxides, silicon nitrides, and silicon oxynitrides, silicon carbides, silicon carbonitrides, combinations thereof and mixtures thereof, with or without hydrogen additions. In some embodiments, passivation layers can comprise, for example, $SiN_xO_y$, $x \leq 4/3$ and $y \leq 2$, silicon oxide ($SiO_2$), silicon nitride ($Si_3N_4$), silicon rich oxide ($SiO_x$, $x<2$), or silicon rich nitride ($SiN_x$, $x<4/3$). The passivation layers can protect the semiconductor material from environmental degradation, reduce surface recombination of holes and electrons, provide structural design features and/or assist with some processing steps, as well as provide anti-reflecting properties for front surfaces. In some embodiments, front passivation layer can comprise $SiN_xO_y$ or other transparent dielectric material. The passivation layer generally is also chemically inert so that the cell is more resistant to any environmental contaminants.

Passivation layers can be formed in a similar reactive deposition process that forms the thin crystalline silicon layer, although the passivation layers can be formed from other techniques such as CVD or PVD techniques using, for example, commercial deposition apparatuses, or with Light Reactive Deposition. Light Reactive Deposition (LRD™) is described further in copending U.S. patent application Ser. No. 09/715,935 now U.S. Pat. No. 7,575,784 to Bi et al., entitled "Coating Formation By Reactive Deposition," Ser. No. 10/414,443 to Bi et al., entitled "Coating Formation By Reactive Deposition," and Ser. No. 11/017,214 now U.S. Pat. No. 7,491,431 to Chiruvolu et al., entitled "Dense Coating Formation By Reactive Deposition," incorporated herein by reference. The passivation layers can be deposited with plasma CVD or the like. The passivation layers generally can have a thickness generally from about 10 nanometers (nm) to 200 nm and in further embodiments from 30 nm to 180 nm and in further embodiments from 50 nm to 150 nm. A person of ordinary skill in the art will recognize that additional ranges of thicknesses within the explicit ranges above are contemplated and are within the present disclosure.

The front passivation layer and/or rear passivation layer generally can have texture to scatter light into the semiconductor layer, for example, to increase effective light path and corresponding absorption of the light. In some embodiments, the textured material can comprise a rough surface with an average peak to peak distance from about 50 nm to about 100 microns. The texture can be introduced during the deposition process to form the passivation layer and/or the texture can be added subsequent to the deposition step.

As noted above, the processing of the semiconductor material into a solar cell involves the delivery of dopant materials for the formation of doped contacts. In general, any reasonable ink can be used that is capable of delivering the desired dopant atoms to the exposed silicon. For example, phosphorous or boron containing liquids can be deposited. In particular, suitable inks can comprise, for example, trioctyl phosphate, phosphoric acid in ethylene glycol and/or propylene glycol or boric acid in ethylene glycol and/or propylene glycol. In some embodiments, inks loaded with inorganic particles can be deposited to provide the dopants. For example, the inorganic particles can comprise doped silica or doped silicon. Doped silica glasses have been used to deliver dopants for photovoltaic cells using photolithographic processes. The use of inks with doped particles can provide for printing of the dopants at desired locations, for example using inkjet printing.

In embodiments of particular interest, the doped particles have an average primary particle size of no more than about 250 nm, in other embodiments no more than about 100 nm, in further embodiments no more than about 50 nm and in additional embodiments no more than about 25 nm. A person of ordinary skill in the art will recognize that additional ranges of particle size within the explicit ranges above are contemplated and are within the present disclosure. In general, doped particles generally can be formed from either reactive flow based approaches or solution based approaches. Submicron inorganic particles with various compositions can be produced by pyrolysis, especially light based pyrolysis or laser pyrolysis, alone or with additional processing. In light-based pyrolysis/laser pyrolysis, light from an intense electromagnetic radiation source drives the reaction to form the particles. For convenience, this application refers to light-based pyrolysis and laser pyrolysis interchangeably, since a suitable intense source of electromagnetic radiation can be used in place of a laser. Laser pyrolysis is useful in the formation of particles that are highly uniform in composition, crystallinity and size. Furthermore, inorganic particles can be effectively formed, for example, using laser pyrolysis that results in particles that have desirable surface properties that lead to high dispersibility and ready incorporation into desired structures, although other sources of particles can be used.

In particular, laser pyrolysis approaches have been developed for the synthesis of submicron multiple metal/metalloid oxide composite particles and other complex metal/metalloid particle compositions as well as doped compositions thereof. The metals/metalloid elements are introduced into the reactant stream. By appropriately selecting the composition in the reactant stream and the processing conditions, submicron particles incorporating the desired metal/metalloid composition stoichiometry optionally with selected dopants can be formed. The synthesis of doped particles with laser pyrolysis is described further in U.S. Pat. No. 6,849,334 to Horne et al., entitled "Optical Materials and Optical Devices," incorporated herein by reference.

In general, the inks can comprise a suitable liquid to form dispersions of the particles. Suitable liquids to disperse metal oxide and metalloid oxide particles generally can comprise water, alcohols, other organic solvents and mixtures thereof. The dispersions can have concentrations from low concentrations to about 50 weight percent or in some embodiment to about 20 weight percent or greater. Well dispersed particles can have a reasonably small secondary particle size indicating that the particles are not highly agglomerated in the dispersion. The particles can have a surface modification to stabilize the particles dispersion and/or other surface active agents can be included in the dispersion.

Particles formed by laser pyrolysis generally have appropriate surface chemistry to be dispersed at moderate concentrations. The stability of particle dispersions can be improved at higher concentrations of particles through surface modification of the particles. In general, the surface properties of the particles influence the dispersion of the particles. The surface properties of the particles generally depend on the synthesis approach as well as the post synthesis processing. Some surface active agents, such as many surfactants, act through non-bonding interactions with the particle surfaces. In some embodiments, desirable properties are obtained through the use of surface modification agents that chemically bond to the particle surface. Suitable surface modification agents include, for example, alkoxysilanes, which chemically bond to metal oxide and metalloid oxide particles through an O—Si bond. In particular, trialkoxysilanes form stable bonds with particle surfaces. The side group of the silane influences the resulting properties of the surface modified particles.

When processing a dry, as-synthesized powder, it has been found that forming a good dispersion of the particle prior to surface modification facilitates the surface modification process and results in particles with a higher degree of surface modification. Surface modification of the particles can increase the range of suitable liquid, and in particular provide for good dispersion of the particles in less polar solvents. Some form of mixing, sonication or the like can be used to improve the dispersion of the particles. In some embodiments, the average secondary particle size can be no more than a factor of four times the average primary particle size, in further embodiments no more than about 3 times the average primary particle size and in additional embodiments no more than about 2 times the average primary particle size. Furthermore, the volume-average particle size may be no more than about 1 micron, in further embodiments no more than about 250 nm, in additional embodiments no more than about 100 nm, in other embodiments no more than about 75 nm and in some embodiments from about 5 fun to about 50 nm.

For printing applications, it can be desirable to form colloidal dispersions. Thus, in some embodiments, the dispersions can be aqueous dispersions with small amounts of ammonia or other compositions to raise the pH of the dispersion. To form the inks from the inorganic particle dispersions, other additives can be included if desired, such as viscosity modifiers, surfactants or the like. For some embodiments, the viscosity can be from 0.1 mPa·s to about 100 mPa·s and in further embodiments from about 0.5 mPa·s to about 25 mPa·s. For some embodiments, the dispersions/inks can have a surface tension from about 2.0 to about 6.0 $N/m^2$ and in further embodiments from about 2.2 to about 5.0 $N/m^2$ and in additional embodiments form about 2.5 to about 4.5 $N/m^2$. A person of ordinary skill in the art will recognize that additional ranges of viscosity and surface tension within the explicit ranges above are contemplated and are within the present disclosure.

The formation of suitable inks comprising silicon oxide particles for performing semiconductor doping is described in copending U.S. patent application Ser. No. 12/006,459, now U.S. Pat. No. 7,892,872 to Hieslmair et al., filed on Jan. 2, 2008, entitled "Silicon/Germanium Oxide Particle Inks, Inkjet Printing and Processes for Doping Semiconductor Substrates," incorporated herein by reference. The formation of suitable inks comprising silicon particles for forming doped semiconductor domains is described further in copending U.S. patent application Ser. No. 12/006,453 to Hieslmair et al. filed on Jan. 2, 2008, entitled "Silicon/Germanium Particle Inks, Doped Particles, Printing and Processes for Semiconductor Applications," incorporated herein by reference. These materials described in these patent applications can be applied to the processes described herein.

Cell Processing and Module Processing

The processing steps described here are appropriate and efficient for the processing of photovoltaic modules, optionally with dynamically designed solar cells within the module. In some embodiments, the solar cells are designed for fabrication from thin silicon foils as the semiconducting sheet. However, at least some of the processing procedures are generally applicable and advantageous for the production of photovoltaic cells with a silicon sheet of any thickness as well as cells formed from other semiconductor materials. Some of the processing steps or series of processing steps are directed specifically to the efficient production of rear side contacts for harvesting of current from the cell. Dopant can be placed through holes in a passivation layer which can be combined with careful placement of current collector material for the formation of the rear contact cells with reduced numbers of processing steps while achieving desirable structures that promise to achieve improved performance with a reduce quantity of materials.

Figure 9:
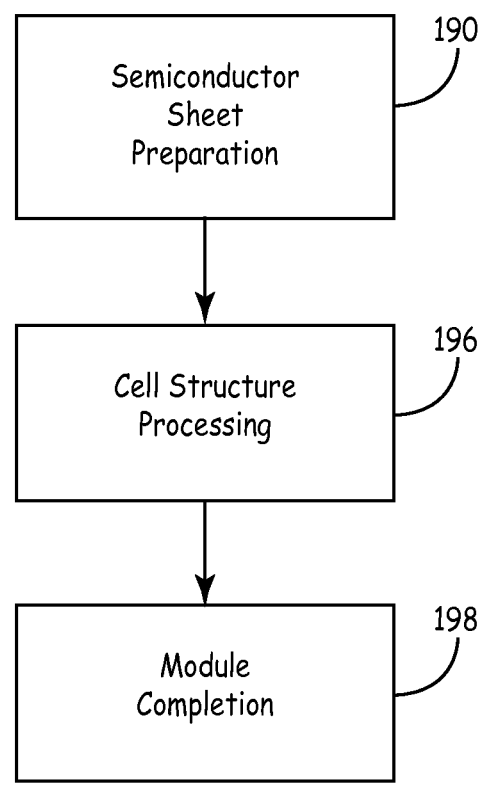
FIG. 9 is a flow diagram indicating the major process steps of module preparation.

In general, the processing steps can comprise, for example, semiconductor sheet preparation 190, cell structure processing 196 and module completion 198, as shown in FIG. 9. In some embodiments of the overall processing approach described herein, the process generally involves the use of one or more large sheets of semiconductor, e.g., silicon, that are divided during the process into individual cells. In general, the processes can provide for appropriate handling of the materials as well as efficient processing with reduced waste and reduced numbers of processing steps without sacrificing the quality of module performance.

The semiconductor sheet preparation 190 is directed to the formation of an initial semiconductor sheet in preparation for performing further processing to form solar cells from the semiconductor sheet. The initial semiconductor sheet structure can be formed generally by any suitable approach. For example, the semiconductor sheet can be cut from a silicon ingot. However, in other embodiments, the semiconductor sheet is formed at least in part with a reactive deposition process. Appropriate reactive deposition processes for forming the semiconductor sheets are described above. Through a reactive deposition process, a very thin foil of silicon can be formed for use in the module. Even though the silicon foil is thin, it can be handled with appropriate transfer techniques that avoid damage to the foil.

Some steps relating to cell structure processing 196 can be performed prior to semiconductor sheet preparation 190. For example, a passivation layer can be deposited prior to forming the semiconductor sheet with the semiconductor sheet being deposited onto the passivation layer. One or both of the passivation layers can be formed as part of the reactive deposition process. The passivation layers are generally textured. The transparent front sheet can provide mechanical support for the semiconductor sheet during the subsequent processing steps.

In some embodiments, in the reactive deposition process, the one or more layers of the structure with a semiconductor layer are formed sequentially onto a release layer. The release layer can have a composition and/or mechanical properties that provide for fracture or release of the structure from the original substrate. Depending on further handling of the silicon foil, either the rear surface or the front surface of the silicon foil can be formed against the release layer. In alternative embodiments, the silicon is directly deposited onto the transparent front sheet so that the front surface of the cell is formed onto the transparent front sheet without any need for a release layer or corresponding transfer. In either orientation, the structure can be further processed, such as heat treated, while associated with the original substrate. While in principle the dopant regions of the cells can be formed through the reactive deposition process, efficient and convenient approaches for forming dopant contacts are described herein that provide for electrical connection to the doped contacts.

In the reactive deposition process involving a release layer, the release layer can be deposited onto a substrate, which may be reusable. The release layer can be a porous, particulate ceramic composition that can be deposited through a reactive deposition process, and suitable compositions include, for example, similar compositions as are suitable for passivation layers. Since the substrates can be reusable, high quality substrates can be used without excessively increasing the cost. In one example of an embodiment, a thin silicon nitride or silicon oxynitride rear passivation layer can be deposited over the release layer. Then, a crystalline silicon layer can be deposited over the rear passivation layer. In some embodiments, a thin front passivation layer can be deposited over the crystalline silicon layer.

Reactive deposition to form silicon foils and passivation layers is described further above in the materials section. In some embodiments, the structure formed by reactive deposition can then be heated to consolidate the passivation layers and/or to anneal the crystalline silicon layer and/or otherwise modify the properties of the layers. An improved method for performing zone melt recrystallization of thin silicon foils is also referenced above.

The semiconductor sheet is further processed to form the solar cell through the formation of doped contacts to harvest the photocurrent and the placement of current collectors to direct the harvested photocurrent. In embodiments of particular interest, the individual solar cells are cut from a larger semiconductor sheet. The solar cells can be positioned to receive light through a transparent front sheet. The discussion herein focuses on the formation of rear contact solar cells, but at least some of the processing steps can be generalized for other doped contact placement based on the teachings herein. The cell structure processing 196 (FIG. 9) can comprise, for example, one or more of the steps in FIG. 10, although the steps are not necessarily performed in the order presented when not necessary for processing considerations, and generally additional processing steps can be included for specific commercial designs.

Figure 10:
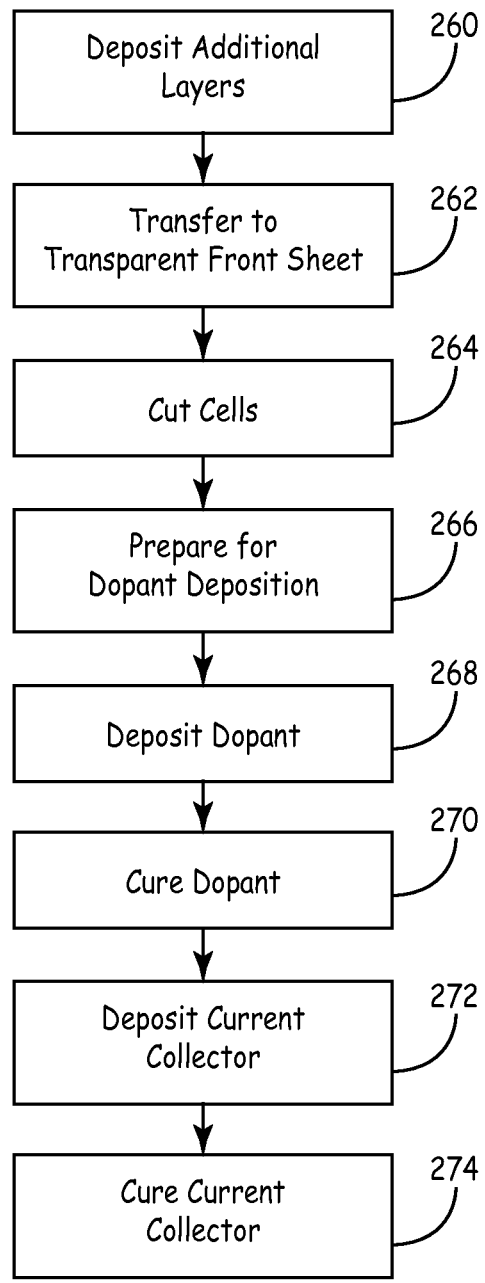
FIG. 10 is a flow diagram indicating steps for solar cell processing, although the order shown in the diagram is not necessarily the processing order.

In general, referring to FIG. 10, cell structure processing 196 can comprise, for example, depositing one or more additional layers 260, transferring the semiconductor to the transparent front sheet 262, cutting cells 264, preparing the structure for dopant deposition 266, depositing dopant composition 268, curing the dopant 270, depositing cell current collectors 272 and curing the current collectors 274, although additional steps can be used, and some steps may be combinable or optional. The deposition of additional layers can involve the formation of, for example, passivation layers along the top and/or bottom surface of the semiconductor sheet. In alternative embodiments, one or more passivation layer can be formed during the process for forming the semiconductor layer. Compositions, parameters and methods for forming passivation layers are described above. Additional protective layers, adhesive layers and processing layers can also be deposited, which can be temporary or layers for the finished solar cell.

The passivation layers for the respective sides of the semiconductor layer can be deposited at appropriate times in the process. The passivation layers are generally textured. The texturing can be done with plasma etching or other suitable method, and/or the texture can be incorporated into the layer during deposition. Additional layers can be deposited as appropriate to form desired structures, such as layered current collectors. Similarly, etching processes and lithographic and photolithographic approaches can be used to pattern layers.

With respect to the transfer of the semiconductor sheet to the transparent front sheet 262, this process depends to a significant degree on the nature of the semiconductor. In general, this process can be performed for thicker semiconductor structures straightforwardly. For thin silicon foils, this process can be directly performed from a structure involving a porous, particulate release layer or prior transfer steps can be performed so that the transfer to the transparent front sheet can take place from a temporary receiving surface. Processes and apparatus for the handling and transfer of thin inorganic foils is described further in copending U.S. provisional patent application 61/062,399 filed on Jan. 25, 2008 to Mosso et al., entitled "Layer Transfer for Large Area Inorganic Foils," incorporated herein by reference. The semiconducting structure with any passivation layers and the like can be laminated to the transparent front sheet with a transparent adhesive or the like.

The cells are cut 264 from the semiconductor sheet at an appropriate point in the cell structure processing process. Generally, the sheet is cut into cells at some point after measurement of the semiconductor, if performed, and before final processing steps to form the complete module. Additionally, the solar cells can be cut from the semiconductor sheet before or after positioning on the transparent front sheet. Cutting after placement on the transparent front sheet eliminates any separate alignment steps, but this processing order generally more or less fixes the particular arrangement of the cells unless additional removal and replacement steps are performed. With the semiconductor structure for the cell in position on the transparent substrate, additional processing can be performed on the back side of the cell until the cells are completed and integrated into the module.

The solar cells can be cut from the semiconductor sheet based on the selected division that optionally may be mapped during the dynamic cell design. If dynamic cell design is not performed, generally the sheet is divided to form approximately equal sized cells. Since photovoltaic modules are typically installed at a site in series and/or in parallel, it is often desirable for modules to have a certain rated current (series) or rated voltage (parallel). To achieve a target current, the cells are divided such that each cell produces a current of approximately the target value. Then, the series connected cells of the module produce an overall current approximately equal to the target value. To reach a target voltage, the rough voltage value of a cell can be used to select a total number of cells to reach the target value. Then, appropriate division of the sheet into cells that add in series to the target value. Setting a current and voltage target simultaneously is possible generally by sacrificing some degree of the power performance.

While the cells are divided in a regular pattern without use of the measurements, advantages can be gained through the dynamic cutting of the cells into sizes that more closely match the current from the individual cells. The use of measurements of the semiconductor foil to dynamically select cell sizes is described further in copending U.S. patent application Ser. No. 12/070,381 filed on the same day as the present application now U.S. published application 2008/0202577 to Hieslmair et al., entitled "Dynamic Design of Solar Cell Structures, Photovoltaic Modules and Corresponding Processes," incorporated herein by reference.

The cells can be cut using reasonable mechanical methods, such as with a saw having a hard edge blade, a fluid jet cutting apparatus or other mechanical methods. However, available laser cutting techniques provide for particular convenience especially with the real time determination of cell placement. Suitable laser cutting systems are available from Oxford Lasers, Inc., Shirley, Mass., USA, and IPG Photonics Corp., Oxford, Mass., USA as well as other commercial sources. In general, any reasonable laser frequency can be used that oblates the material, such as Ytterbium lasers operating at 1070 nm. If the semiconductor sheet is cut while adhered to the transparent substrate, the selected cutting approach may cut into the transparent substrate slightly without damaging cell performance as long as the transparent substrate maintains its mechanical integrity. In general, the laser cutting of the cells can be performed before, after or between steps relating to formation of the doped contacts.

The preparation for dopant deposition 266, if performed, generally involves providing access to the semiconductor surface with respect to passivation layers or other layers that can be placed along the semiconductor surface along with the dopant. In some embodiments, a passivation layer can be patterned to provide exposed regions that can accept dopant. Photolithographic techniques, other lithographic techniques, which can involve various etching approaches, can be used for patterning of the structure. In principle, the patterning of the passivation layer or other covering layers can performed after the doping process if the dopants can be placed without significant migration, although this processing order of doping first provides constraints on the other processing steps and involves fairly precise relative positioning to properly expose the resulting dopants. In some embodiments, a desirable approach comprises the drilling of holes through a passivation layer. The dopants can be printed into the holes, which become the location of the doped contacts. The reference to holes is not intended to imply cylindrical structures, and holes can have selected shapes and sizes. Appropriate ranges of hole sizes are discussed above.

Appropriate positions for doping can be determined within each cell. Patterns for positioning the doped contacts are discussed in the context of FIGS. 4-8 above. For example, the holes for the dopant placement can place on a rectangular grid or other appropriate geometric arrangement. In some embodiment, appropriate positions for dopant deposition can be determined dynamically within each cell. The dynamic selection of dopant placement can be based on measurements of the semiconductor properties across the semiconductor sheet. The use of dynamic dopant placement based on semiconductor measurements is described further in copending U.S. patent application Ser. No. 12/070,381 filed on the same day as the present application now published U.S. patent application 2008/0202577 to Hieslmair et al., entitled "Dynamic Design of Solar Cell Structures, Photovoltaic Modules and Corresponding Processes," incorporated herein by reference.

Figure 11:
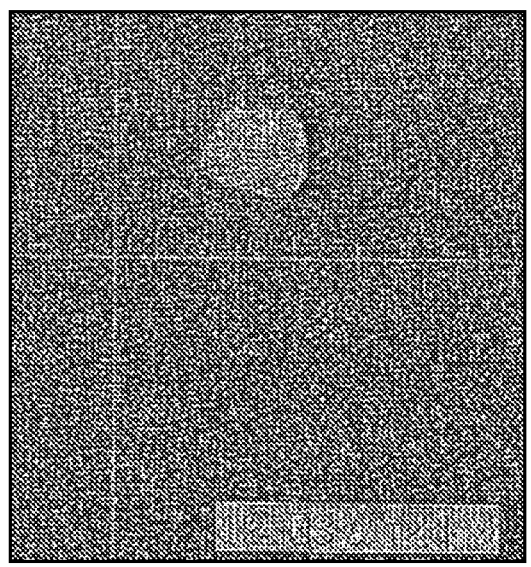
FIG. 11 is a photomicrograph of an actual hole drilled through a silicon nitride layer on a silicon layer.

Holes through a passivation layer can be laser drilled or mechanically drilled. For example, laser hole drilling can use a green to UV laser can be used with a short pulse from 10 nanoseconds (ns) to 100 ns, although other laser frequencies and firing sequences can be used. Laser fluences of about 2 to about 30 J/cm$^2$ per pulse are estimated to be appropriate for a single pulse to open a hole. A person of ordinary skill in the art will recognize that additional ranges within the explicit laser parameter ranges above are contemplated and are within the present disclosure. Experiments have shown that for a silicon rich silicon nitride film with a thickness of about 60 nm, a single 25 ns pulse at 355 nm wavelength from a wavelength tripled YAG laser formed a suitable opening with a fluence of 4.3 J/cm$^2$. A photomicrograph of the resulting hole is shown in FIG. 11. Shorter wavelengths and shorter pulse times are expected to cause less damage to the underlying silicon, but there may be a range of tradeoffs from a commercial perspective, such as cost.

Figure 12:
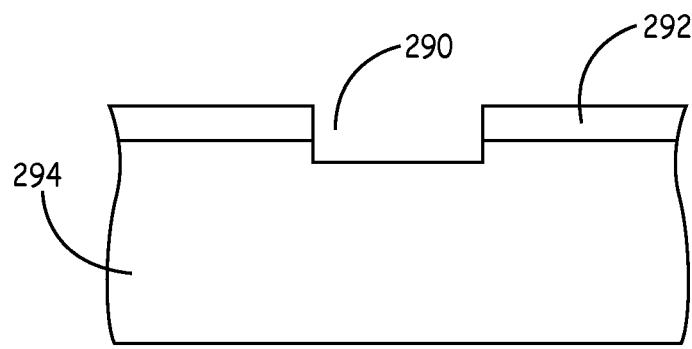
FIG. 12 is a fragmentary, sectional side view showing a structure following laser drilling to form a hole through a passivation layer.

The laser drilling of the holes is expected to create some debris. A shallow etch can remove the debris as well as a damaged layer in the silicon. Suitable chemical etching can be performed with nitric/hydrofluoric acid mixtures, tetramethyl-ammonium hydroxide (TMAH) or potassium hydroxide (KOH) etching compositions. A schematic sectional view of the resulting structure after the etch is shown in FIG. 12, in which hole 290 extends through passivation layer 292 and partially into semiconductor 294. In general, after the laser ablation, chemical etch and/or other removal steps, from about 1% to about 50%, in further embodiments from about 5% to about 30% and in additional embodiments about 10% to about 25% of the dielectric passivation layer is removed to expose clean, effectively undamaged silicon underneath the holes with the remaining portions being covered by the passivation layer. A person of ordinary skill in the art will recognize that additional ranges of passivation layer removal within the explicit ranges above are contemplated and are within the present disclosure.

A dopant composition can then be applied 268 through the holes to contact the exposed silicon. In some embodiments, the dopant is delivered in a dopant carrying ink, which can be dispensed, for example, using an inkjet printer of the like. Inkjet resolution over large areas is presently readily available at 200 to 800 dpi, which is adequate to pattern 100 to 200 pitch lines with single drops to cover the laser scribed holes. Also, inkjet resolution is continuing to improve. Two inks generally are used, with one ink providing n-type dopants, such as phosphorous and/or arsenic, and the second ink providing p-type dopants, such as boron, aluminum and/or gallium. Suitable inks are described above that can comprise a dopant composition as a liquid or dissolved in a liquid, or comprising dopant particles, such as doped silica particles or doped silicon particles.

After the dopant is deposited, the dopant can be cured 270 (FIG. 10) as appropriate to provide desired electrical interaction between the doped contact and the semiconductor material. For example, after depositing the dopant inks, an optional drying step can be used to remove solvents and/or other organics. In some embodiments, a thin film with a thickness of less than a micron can be left for further dopant cure processing. The nature of the dopant cure depends on the nature of the dopant composition. For dopant comprising liquids and silica particle inks, the dopant is driven into the silicon layer to form the doped contacts, while for silicon particle inks, the silicon can be fused in place to form the doped contacts.

For appropriate embodiments, during the drive-in step, the deposited dopant element is driven into the silicon to form a doped contact in the silicon. The drive-in can be performed with heating in an oven to accelerate solid state diffusion. Thermal drive-in of dopants generally results in a Gaussian profile of dopant in the silicon so that a relatively deep dopant structure generally is obtained to obtain a desired overall doping level. Generally, the dopant levels can be from about $5.0 \times 10^{18}$ to about $5 \times 10^{19}$ atoms per cubic centimeter (cc).

However, in some embodiments, a laser drive-in is performed, for example, with a UV laser, such as an excimer laser, although a wide range of laser frequencies can be suitable for the laser-based dopant drive in. In particular, excimer laser pulses of 10 to 1000 ns can result in melting of silicon at temperatures exceeding 1400° C. to depths of 20 to 80 nm. As a specific example, Excimer laser fluences of about 0.75 J/cm$^2$ for a 20 ns pulse or 1.8 J/cm$^2$ for a 200 ns pulse are suitable parameters for shallow molten regions, although other lasers, laser frequencies and other power parameters can be used as appropriate. Dopants in the overlayer diffuse rapidly into the melted silicon, but generally diffuse very little past the melted silicon. Thus, an approximately step-wise dopant profile can be achieved with dopant concentrations possibly reaching levels greater than solubility. Additionally, the bulk of the silicon layer and lower layers remain at or near ambient room temperature, and a lower temperature process can be advantageous since less energy is consumed.

In some embodiments, with a laser based drive in, a heavily doped contact can be formed with a relatively shallow profile, with thickness from about 10 nm to about 500 nm and in further embodiments from about 20 nm to about 100 nm. In some embodiments with a shallow profile, the dopant profile has at least about 95 atomic percent of the dopant in the semiconductor within about 500 nm of the semiconductor surface and in further embodiments within about 100 nm of the semiconductor surface. A person of ordinary skill in the art will recognize that additional ranges of doped contact depth within the explicit ranges above are contemplated and are within the present disclosure. The dopant profile can be measured using Secondary Ion Mass Spectrometry (SIMS) to evaluate the elemental composition along with sputtering or other etching to sample different depths from the surface.

Similarly, a doped-silicon deposit on the surface of the silicon semiconducting sheet can be melted to form a doped contact in association with the semiconducting sheet. The silicon particles can be melted in an oven or the like, or by placing the structure in a light based heating system, such as a laser-based scanning apparatus. Again, light sources, such as lasers, with a wide range of frequencies can be adapted to cure the silicon particles into a doped contact.

Some dopant inks may leave little if any residue after drive-in. Dopant inks using doped silica ($SiO_2$) generally are cleaned from the surface following dopant drive-in. Residual $SiO_2$ and some impurities can be removed with an HF etch.

In additional or alternative embodiments, the dopant deposition 268 and dopant curing 270 can be performed in a plurality of alternating steps with different dopant compositions. In particular, a first dopant composition can be formed as a layer. Then, a drive in step is performed using irradiation beam, such as a laser beam. The radiation beam can be focused to cure the dopant at the desired location, e.g., corresponding to a hole through a passivation layer. The dopant can comprise a dopant liquid and/or doped particles, such as silicon particles or silica particles. The curing is performed as described above.

After a first dopant is cured at selected locations, residual portions of the layer are washed off, such as with an organic solvent or an etching composition, in which at least a significant portion of the cured dopant remains. Then, a second layer of a different dopant is applied. Irradiation is used to cure the second dopant at a second set of locations. Then, the residual of the second dopant layer is removed. In this way, n-dopants and p-dopants can be successively deposited in either order. Spin coating, spray coating or other convenient coating approach can be used to form the layers, for example, with a dopant ink as described herein.

Referring to FIG. 10, current collector materials are deposited 272 to form electrical connections with the doped contacts so that the harvested photocurrent can be guided external to the cell. Current collectors are formed to electrically connect the doped contacts to form two poles of the cell that are suitable to connection to a module terminal or another cell. Within a cell, the doped contacts are electrically connected within the cell configuration, generally with particular polarities, i.e., types of dopant contacts, connected in parallel. The deposition of the current collector material can be performed, for example, using an inkjet to deposit metallization materials directly or to deposit a conductive seed pattern for subsequent electroplating. In some embodiments, direct deposition of metallization material can comprise depositing with an inkjet an ink with a polymer-silver particle composite For electroplating based embodiments, a seed layer can comprise any electrically conductive material, such as a layer of Cu, Ag, or Ni. Use of a seed layer and subsequent electroplating is described further, for example, in U.S. Pat. No. 6,630,387 to Horii, entitled "Method for Forming Capacitor of Semiconductor Memory Device Using Electroplating Method," incorporated herein by reference.

An appropriate approach for curing of the current collector material 274 (FIG. 10) depends on the nature of the current collector material. In some embodiments, the current collector material can be heated to anneal metal or other materials to form a good juncture. Polymer metal particle composites can be cured into a highly conductive material upon moderate heating that is effective to crosslink the polymer. Some polymer composites can be cured with radiation.

In some embodiments, inkjet metallization can be extended to connect multiple solar cells in series if a bridge is used to span the gap formed from cutting the cells. The bridge should be formed from an electrically insulating filler. Suitable fillers include, for example, compliant, flexible polymers that do not introduce strains into the module structure. Suitable polymers can be deposited using straightforward processes, such as extrusion, molding or the like. The formation of a bridge and inkjet metallization over the bridge eliminates the need for soldering cells together. Alternatively, the cells can be soldered together with copper wires or the like, or other approaches to form the electrical connections can be used.

Referring to FIG. 9, once the cells are completed, further processing steps can be performed to complete module formation 198. During final processing steps to complete the module, electrodes of the solar cells can be connected in series, and other electrical connects can be formed as desired. Also, appropriate electrodes of cells at the end of the series are connected to module terminals. Specifically, once the electrical connections between cells are completed, the external module connections can be formed, and the rear plane of the module can be sealed. A backing layer can be applied to seal the rear of the cell. Since the rear sealing material does not need to be transparent, a range of materials and processes can be used, as discussed above. If a heat sealing film is used, the film is put in place, and the module is heated to moderate temperatures to form the seal without affecting the other components. Then, the module can be mounted into a frame as desired.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

I claim:

1. A solar cell comprising a semiconductor layer comprising silicon, germanium, alloys thereof or combinations thereof having a front surface and a rear surface,
    a first doped domain along at least a portion of the front surface,
    a reflective coating over at least a portion of the rear surface,
    a second doped domain along at least a portion of the rear surface,
    a first electrical interconnect and a second electrical interconnect,
    wherein at least a portion of the first doped domain, of the second doped domain or of both doped domains protrude as a structure above the semiconductor surface and extend into the semiconductor surface and the portion protruding above the semiconductor surface consists essentially of doped silicon, doped germanium or alloys thereof or combinations thereof; and
    wherein the first electrical interconnect is in contact with the first doped domain and the second electrical interconnect is in contact with the second doped domain.

2. The solar cell of claim 1 further comprising a dielectric layer in contact with the front surface and wherein the first doped domain extends into a window in the dielectric layer.

3. The solar cell of claim 1 wherein the first doped domain comprises an n-type dopant.

4. The solar cell of claim 3 wherein the first doped domain comprises a dopant selected from the group consisting of P, As, Sb and combinations thereof.

5. The solar cell of claim 1 wherein at least about 95 atomic percent of the dopant in the portion of the first doped domain extending into the semiconductor layer is within about 100 nm of the front surface.

6. The solar cell of claim 1 wherein the first doped domain comprises a p-type dopant selected from the group consisting of B, Al, Ga, In and combinations thereof.

7. The solar cell of claim 1 wherein the first doped domain has a dopant concentration of about $5.0 \times 10^{18}$ to about $5 \times 10^{19}$ atoms per cubic centimeter.

8. The solar cell of claim 1 wherein the semiconductor layer has a thickness from about 5 microns to about 100 microns.

9. The solar cell of claim 2 wherein the dielectric layer in contact with the front surface comprises a silicon oxide, a silicon nitride, a silicon oxynitride or a combination thereof.

10. The solar cell of claim 2 comprising a plurality of doped domains extending into a plurality of windows in the dielectric layer.

11. The solar cell of claim 10 wherein the plurality of windows are openings having an average diameter from about 5 microns to about 100 microns.

12. The solar cell of claim 10 wherein the plurality of windows are openings having a spacing from about 50 microns to about 500 microns.

13. The solar cell of claim 1 wherein the first doped domain comprises an n-type dopant and wherein the semiconductor layer comprises a doped semiconductor layer doped with a p-type dopant.

14. The solar cell of claim 1 wherein the second doped domain comprises a p-type dopant, and the first doped domain comprises an n-type dopant.

15. The solar cell of claim 1 further comprising a second dielectric layer in contact with the rear surface, wherein the second doped domain extends into a window in the second dielectric layer.

16. The solar cell of claim 15 wherein the second dielectric layer have a plurality of windows, wherein the plurality of windows are openings having an average diameter from about 5 microns to about 100 microns.

17. The solar cell of claim 1 wherein the first doped domain or the second doped domain has a dopant concentration of about $5.0 \times 10^{18}$ to about $5 \times 10^{19}$ atoms per cubic centimeter.

18. The solar cell of claim 1 wherein at least a portion of the first doped domain both protrude as a structure above the semiconductor surface and extend into the semiconductor surface.

19. The solar cell of claim 1 wherein at least a portion of the second doped domain both protrude as a structure above the semiconductor surface and extend into the semiconductor surface.

* * * * *